(12) United States Patent
Shimamoto et al.

(10) Patent No.: US 9,685,455 B1
(45) Date of Patent: Jun. 20, 2017

(54) METHOD OF MANUFACTURING SEMICONDUCTOR DEVICE HAVING 3D STRUCTURE

(71) Applicant: Hitachi Kokusai Electric Inc., Tokyo (JP)

(72) Inventors: Satoshi Shimamoto, Toyama (JP); Takashi Nakagawa, Toyama (JP)

(73) Assignee: Hitachi Kokusai Electric, Inc., Tokyo (JP)

( * ) Notice: Subject to any disclaimer, the term of this patent is extended or adjusted under 35 U.S.C. 154(b) by 0 days.

(21) Appl. No.: 15/385,133

(22) Filed: Dec. 20, 2016

(30) Foreign Application Priority Data

Sep. 6, 2016 (JP) ................. 2016-173628

(51) Int. Cl.
| | | |
|---|---|---|
| *H01L 21/00* | (2006.01) | |
| *H01L 27/11582* | (2017.01) | |
| *H01L 21/02* | (2006.01) | |
| *H01L 21/311* | (2006.01) | |
| *H01L 21/768* | (2006.01) | |
| *H01L 27/11578* | (2017.01) | |
| *H01L 27/06* | (2006.01) | |
| *H01L 27/11551* | (2017.01) | |
| *H01L 21/822* | (2006.01) | |

(52) U.S. Cl.
CPC .... *H01L 27/11582* (2013.01); *H01L 21/0217* (2013.01); *H01L 21/02271* (2013.01); *H01L 21/02359* (2013.01); *H01L 21/31105* (2013.01); *H01L 21/76877* (2013.01); *H01L 21/8221* (2013.01); *H01L 27/0688* (2013.01); *H01L 27/11551* (2013.01); *H01L 27/11578* (2013.01); *H01L 2924/351* (2013.01)

(58) Field of Classification Search
CPC ......... H01L 2924/351; H01L 27/11578; H01L 21/8221; H01L 27/0688; H01L 27/11551
See application file for complete search history.

(56) References Cited

U.S. PATENT DOCUMENTS

| | | | | |
|---|---|---|---|---|
| 8,895,415 | B1* | 11/2014 | Fox ................... | H01L 21/02532 438/482 |
| 9,230,987 | B2* | 1/2016 | Pachamuthu ..... | H01L 27/11582 |
| 2012/0058629 | A1* | 3/2012 | You ................... | H01L 27/11582 438/479 |
| 2012/0280299 | A1* | 11/2012 | Yun ..................... | H01L 27/1157 257/314 |
| 2015/0008506 | A1* | 1/2015 | Yang ................. | H01L 27/11582 257/324 |
| 2016/0163730 | A1* | 6/2016 | Lim .................. | H01L 27/11582 257/314 |

(Continued)

*Primary Examiner* — Ngan Ngo
(74) *Attorney, Agent, or Firm* — Edell, Shapiro & Finnan LLC

(57) ABSTRACT

The technique described herein can form a semiconductor device having a favorable characteristic over a flash memory with a 3D structure. Provided is a method of manufacturing a semiconductor device, including: (a) forming a stacked structure having an insulating film and a sacrificial film stacked therein by performing a combination a plurality of times, the combination including: (a-1) forming the insulating film on a substrate; (a-2) forming the sacrificial film on the insulating film; and (a-3) modifying at least one of the insulating film and the sacrificial film to reduce a difference between stresses of the insulating film and the sacrificial film.

15 Claims, 13 Drawing Sheets

(56) References Cited

U.S. PATENT DOCUMENTS

| | | | |
|---|---|---|---|
| 2016/0300848 A1* | 10/2016 | Pachamuthu | H01L 21/768 |
| 2016/0329343 A1* | 11/2016 | Pachamuthu | H01L 27/11582 |
| 2017/0062330 A1* | 3/2017 | Kim | H01L 23/5226 |
| 2017/0069645 A1* | 3/2017 | Kubota | H01L 27/11556 |
| 2017/0069650 A1* | 3/2017 | Iinuma | H01L 27/11582 |
| 2017/0069754 A1* | 3/2017 | Iinuma | H01L 29/7843 |

* cited by examiner

METHOD OF MANUFACTURING SEMICONDUCTOR DEVICE HAVING 3D STRUCTURE

CROSS REFERENCE TO RELATED APPLICATIONS

This application claims foreign priority under 35 U.S.C. §119(a)-(d) to Japanese Patent Application No. 2016-173628, filed on Sep. 6, 2016, the entire contents of which are hereby incorporated by reference.

FIELD OF THE INVENTION

The present disclosure relates to a method of manufacturing a semiconductor device.

BACKGROUND

Recently, the integration density of semiconductor devices has continued to increase. As one of methods for increasing the integration density of a semiconductor device, a three-dimensional (3D) structure has been proposed, the 3D structure including components such as electrodes arranged in a 3D manner. A semiconductor device having a 3D structure is disclosed in Japanese Patent Publication No. 2015-50466, for example.

During a process of forming a flash memory having a 3D structure, a stacked film may be formed by alternately stacking insulating films and sacrificial films. However, due to a factor such as a difference in coefficient of thermal expansion between the insulating film and the sacrificial film, stress is applied to a silicon wafer. Thus, while the stacked film is formed, the stacked film may be destroyed. Such a phenomenon may degrade the characteristic of the semiconductor device.

SUMMARY

Described herein is a technique for forming a semiconductor device such as a flash memory with a 3D structure having a favorable characteristic.

According to one aspect described herein, a method of manufacturing a semiconductor device includes: (a) forming a stacked structure having an insulating film and a sacrificial film stacked therein by performing a combination a plurality of times, the combination including: (a-1) forming the insulating film on a substrate; (a-2) forming the sacrificial film on the insulating film; and (a-3) modifying at least one of the insulating film and the sacrificial film to reduce a difference between stresses of the insulating film and the sacrificial film.

DETAILED DESCRIPTION

First Embodiment

Hereafter, a first embodiment described in this specification will be described.

Figure 1:
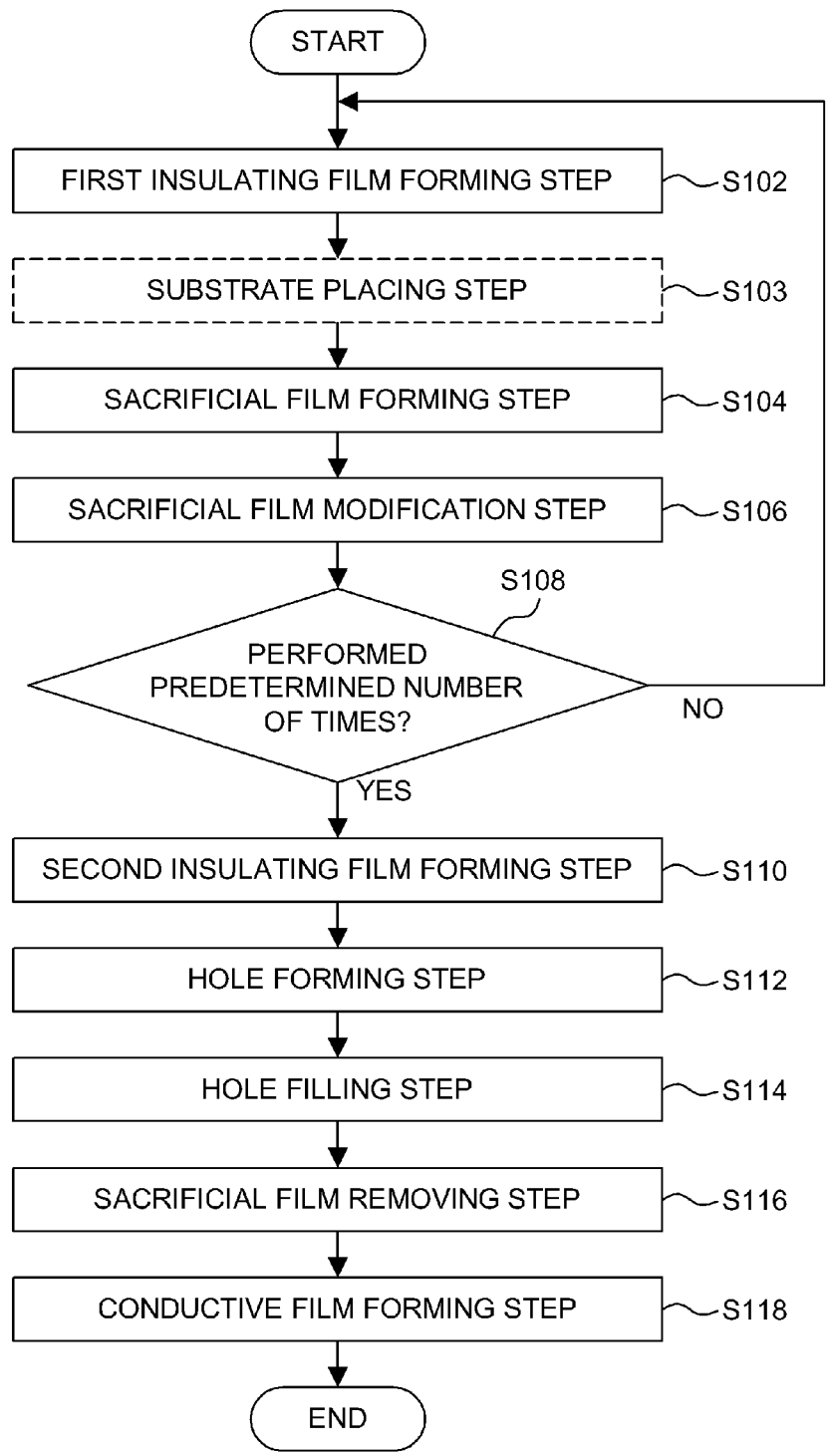
FIG. 1 is a diagram illustrating a manufacturing flow for a semiconductor device according to a first embodiment described herein.
Figure 9:
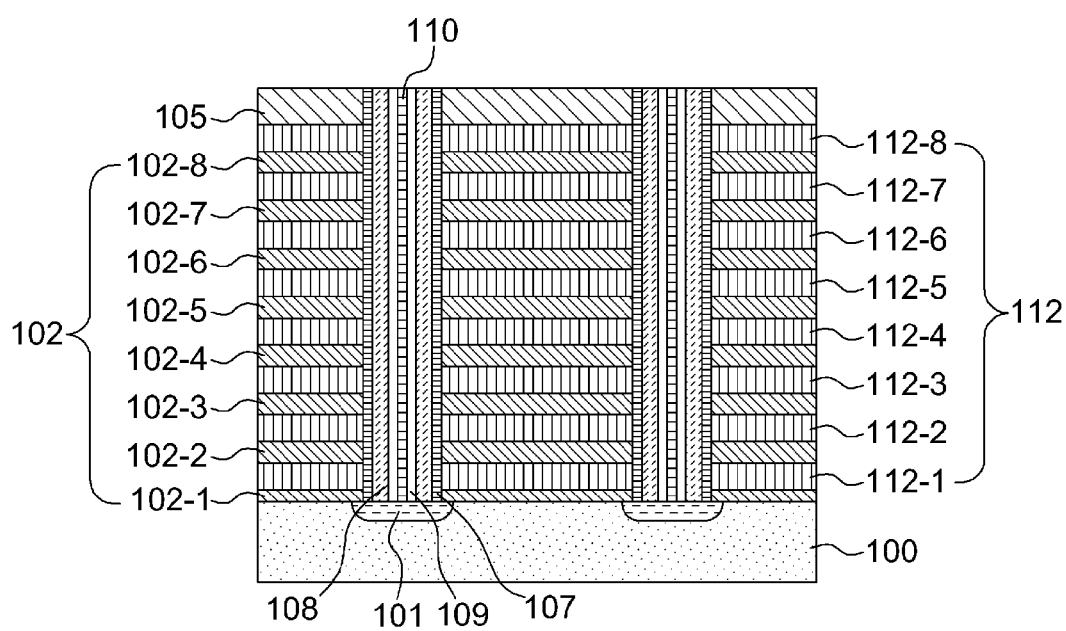
FIG. 9 is a diagram illustrating a state of the processed wafer according to the first embodiment described herein.

Referring to FIG. 1, one of processes for manufacturing a semiconductor device will be exemplified. Through the process, a semiconductor device having a 3D structure is formed, the semiconductor device including electrodes arranged in a 3D manner. As illustrated in FIG. 9, the semiconductor device has a structure in which insulating films 102 and electrodes 112 are alternately stacked on a wafer 100. Hereafter, a specific flow for manufacturing the semiconductor device will be described.

Step S102

Figure 2:
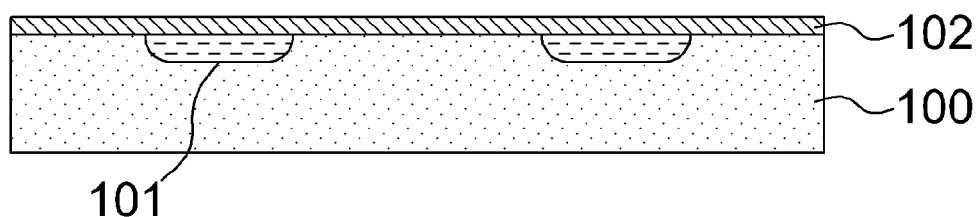
FIG. 2 is a diagram illustrating a state of a processed wafer according to the first embodiment described herein.

A first insulating film forming step S102 will be described with reference to FIG. 2. FIG. 2 is a diagram illustrating an insulating film 102 formed on the semiconductor wafer 100. A common source line (CSL) 101 is formed in the wafer 100. The insulating film 102 is also referred to as a first insulating film.

The first insulating film forming step S102 is performed to form the insulating film on the wafer 100. The insulating film 102 may include a silicon oxide (SiO) film. The SiO film is formed by supplying a silicon containing gas and oxygen containing gas onto the wafer 100 while heating the wafer 100 at a predetermined temperature. The silicon containing gas contains silicon as a main component, and the oxygen containing gas contains oxygen as a main component. The silicon containing gas contains impurities such as chlorine as described later. In this specification, the silicon containing gas and the oxygen containing gas which are used at the first insulating film forming step S102 are collectively referred to as a first insulating film forming gas. The first insulating film forming gas is also simply referred to as an insulating film forming gas.

Step S104

Figure 3:
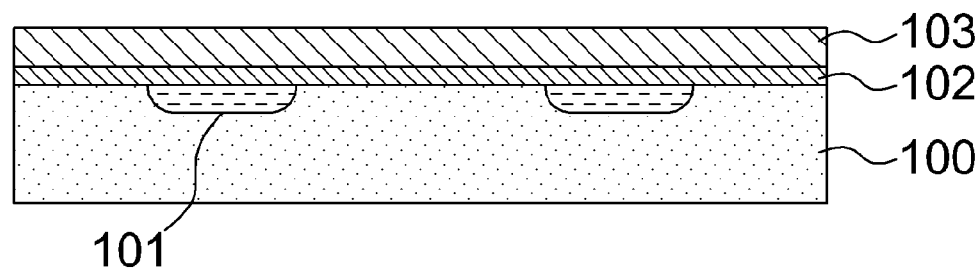
FIG. 3 is a diagram illustrating a state of the processed wafer according to the first embodiment described herein.

A sacrificial film forming step S104 will be described with reference to FIG. 3. Referring to FIG. 3, a sacrificial film 103 is formed on the insulating film 102. The sacrificial film 103 is removed through a sacrificial film removing step S116 described later, and has an etch selectivity over the insulating film 102. The etch selectivity refers to a characteristic that the sacrificial film is etched and the insulating film is not etched, when the films are exposed to an etching solution.

The sacrificial film 103 includes a silicon nitride (SiN) film, for example. The SiN film is formed by supplying a silicon containing gas and nitrogen containing gas onto the wafer 100 while heating the wafer 100 at a predetermined temperature. The silicon containing gas contains silicon as a main component, and the nitrogen containing gas contains nitrogen as a main component. The silicon containing gas contains impurities such as chlorine as described later. Depending on a difference between mechanisms for forming a film, the temperature of the wafer 100 heated at the insulating film forming step S102 is different from the temperature of the wafer 100 heated at the sacrificial film forming step S104. In this specification, the silicon containing gas and the nitrogen containing gas which are used in the sacrificial film forming step S104 are collectively referred to as a sacrificial film forming gas.

Step S106

Figure 4:
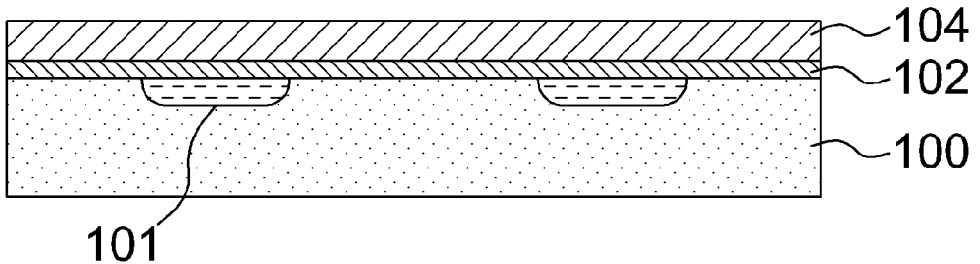
FIG. 4 is a diagram illustrating a state of the processed wafer according to the first embodiment described herein.

A sacrificial film modification step S106 will be described with reference to FIG. 4. The sacrificial film modification step S106 is simply referred to as a modification step. The film 104 is a modified sacrificial film obtained by modifying the sacrificial film 103. At step S106, "modification" indicates approximating the stress of the sacrificial film 103 to the stress of the insulating film 102.

Figure 19:
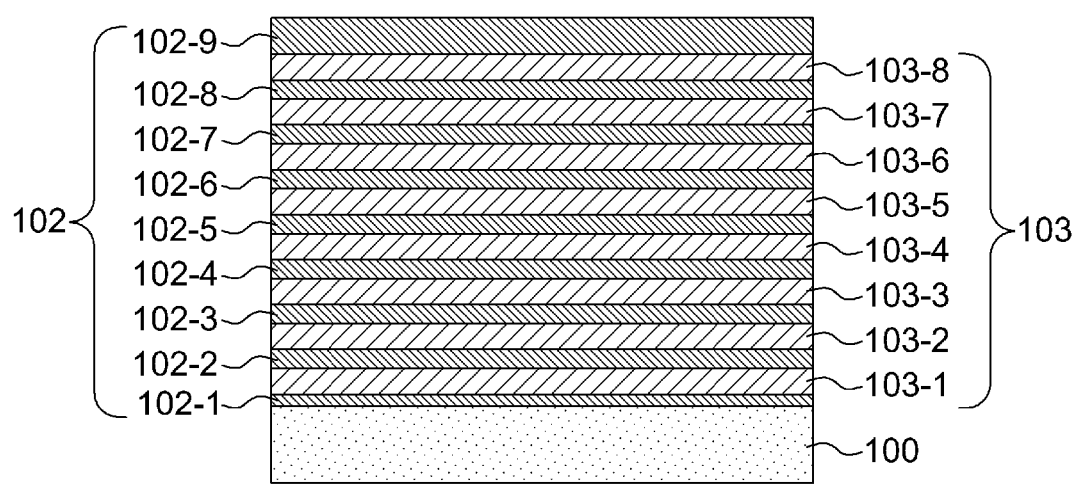
FIG. 19 is a diagram illustrating a state of a processed wafer according to a comparative example.

Hereafter, the reason to perform modification will be described with reference to FIG. 19 illustrating a comparative example. FIG. 19 illustrates a case in which the sacrificial film 103 is not modified. That is, FIG. 19 illustrates a case in which the insulating film 102 and the sacrificial film 103 are alternately stacked, without performing the sacrificial film modification step S106. The insulating film 102 includes insulating films 102-1 through 102-8 which are sequentially arranged from the bottom to the top. The sacrificial film 103 includes sacrificial films 103-1 through 103-8 which are sequentially arranged from the bottom to the top. As described above, the insulating film 102 is formed by supplying the silicon containing gas and the oxygen containing gas onto the wafer 100 while heating the wafer 100 at a predetermined temperature. The sacrificial film 103 is formed by supplying the silicon containing gas and the nitrogen containing gas onto the wafer 100 while heating the wafer 100 at a predetermined temperature different from when the insulating film 102 is formed.

In general, the SiO film is known to have high compressive stress, and the SiN film is known to have high tensile stress. That is, the SiO film and the SiN film have the opposite characteristics over stress. The stress characteristics of the films become conspicuous when the films are heated.

In the example illustrated in FIG. 19, the stacked film is formed by repeating a process of forming the insulating film 102 made of SiO film and a process of forming the sacrificial film 103 made of SiN film. However, while the stacked film is formed, the insulating film 102 and the sacrificial film 103 are heated. Thus, a difference in stress between the insulating film 102 and the sacrificial film 103 becomes conspicuous. Thus, a problem such as film peel-off may occur between the insulating film 102 and the sacrificial film 103. In this case, the semiconductor device may be destroyed or the yield may be reduced.

For example, suppose that, when the sacrificial film 103-5 is formed, the wafer 100 is heated at a temperature for forming the SiN film. At this time, the compressive stress of the insulating films 102-1 through 102-5 under the sacrificial film 103-5 may be increased, and the tensile stress of the sacrificial films 103-1 through 103-4 may be increased. Therefore, a difference in stress between the insulating film 102 and the sacrificial film 103 occurs. Such a stress difference may destroy the semiconductor device.

In order to reduce such a stress difference, the sacrificial film modification step S106 is performed to change the sacrificial film 103 into the modified sacrificial film 104, thereby approximating the stress of the sacrificial film 103 to the stress of the insulating film 102. The details of the modification method will be described later.

Step S108

Figure 5:
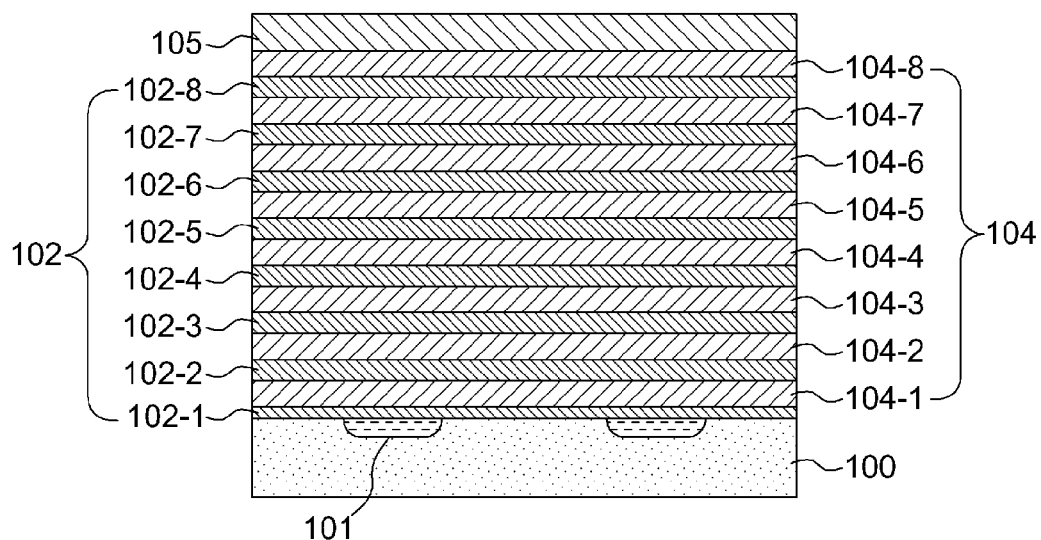
FIG. 5 is a diagram illustrating a state of the processed wafer according to the first embodiment described herein.

Step S108 is performed to determine whether the above-described process from the insulating film forming step S102 to the sacrificial film modification step S106 was performed a predetermined number of times. That is, step S108 includes determining whether the predetermined number of insulating films 102 and the predetermined number of modified sacrificial films 104 were stacked as illustrated in FIG. 5. In the first embodiment, the predetermined number may be set to eight, for example. Thus, eight insulating films 102 from the insulating film 102-1 to the insulating film 102-8 and eight modified sacrificial films 104 from the modified sacrificial film 104-1 to the modified sacrificial film 104-8 are alternately formed. The modified sacrificial films 104-1 through 104-8 are sequentially arranged from the bottom to the top.

When it is determined at step S108 that the process was performed the predetermined number of times ("NO"), the first insulating film forming step S102 is performed. When it is determined at step S108 that the process was performed the predetermined number of times ("YES"), a second insulating film forming step S110 is performed.

Step S110

As illustrated in FIG. 5, step S110 is performed to form an insulating film 105. The insulating film 105 is formed through the same method as the insulating film 102, and formed on the modified sacrificial film 104.

Step S112

Figure 6A:
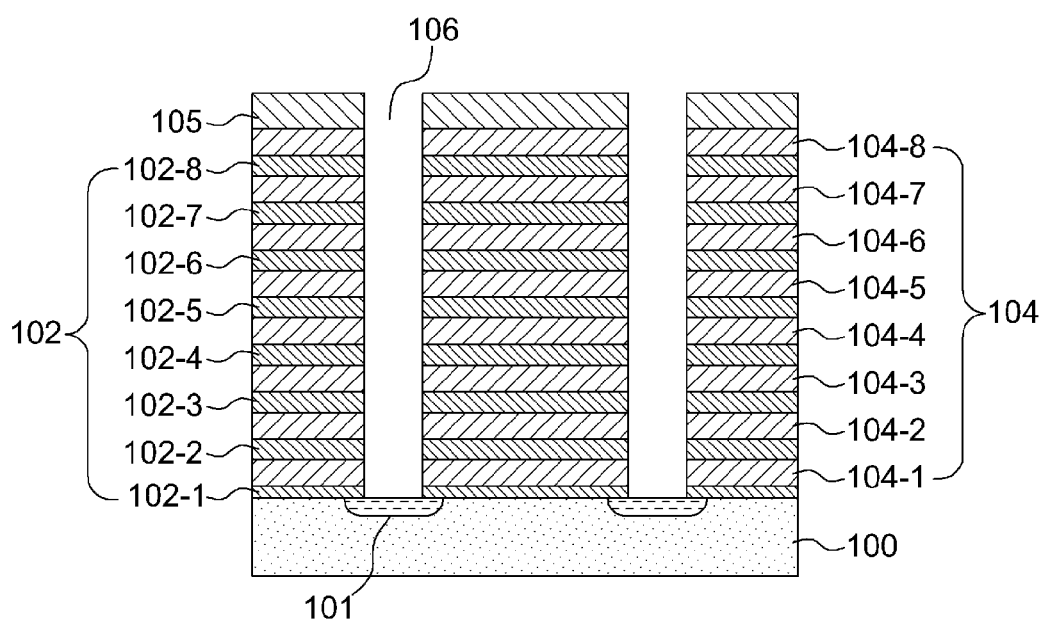
FIGS. 6a and 6b are side and top view diagrams illustrating a state of the processed wafer according to the first embodiment described herein.
Figure 6B:
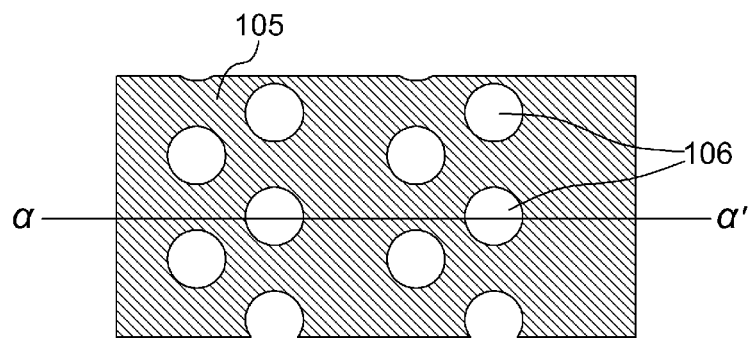

Referring to FIGS. 6A and 6B, step S112 will be described. FIG. 6A is a diagram seen from a side, and FIG. 6B is a diagram illustrating the structure of FIG. 6A, when seen from the top. FIG. 6A is a cross-sectional view taken along the line a-a' of FIG. 6B.

Step S112 is performed to form a hole 106 in the stacked structure of the insulating films 102 and 105 and the modified films 104. As illustrated in FIG. 6A, the hole 106 exposes the CSL 101. As illustrated in FIG. 6B, a plurality of holes 106 are formed at the surface of the insulating film 105.

Step S114

A hole filling step S114 will be described with reference to FIG. 7. The hole filling step S114 is performed to fill the hole 106 formed through step S112 with a film such as a charge trap film. In the hole 106, a passivation film 107, a stacked film 108 of an inter-gate insulating film, charge trap film and tunnel insulating film, a channel polysilicon film 109 and a charge insulating film 110 are sequentially formed from the outer circumference toward the center. Each of the films is cylindrical.

For example, the passivation film 107 may include a SiO or metal oxide film, and the stacked film 108 of inter-gate insulating film, charge trap film and tunnel insulating film may include a SiO—SiN—SiO film. In order to avoid a damage of the stacked film 108 when the modified sacrificial film 104 is removed, the passivation film 107 is formed on the inner surface of the hole 106 so as to protect the stacked film 108.

Step S116

Figure 8:
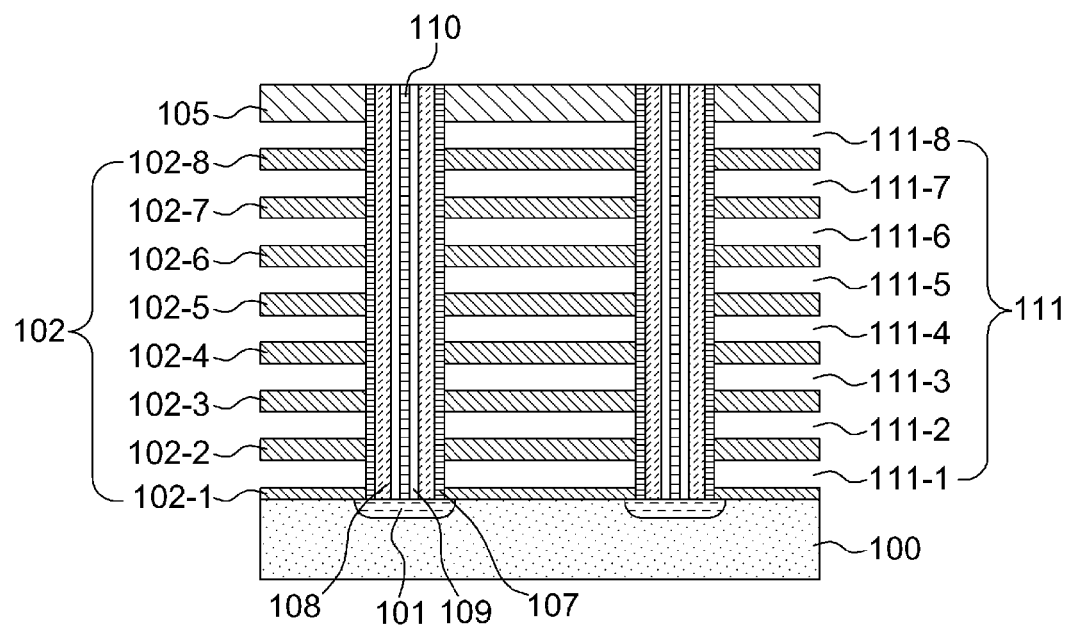
FIG. 8 is a diagram illustrating a state of the processed wafer according to the first embodiment described herein.

Referring to FIG. 8, a sacrificial film removing step S116 will be described. At the sacrificial film removing step S116, the modified sacrificial film 104 is removed through wet etching. As a result obtained by removing the modified sacrificial film 104, a void 111 is formed at the position from which the modified sacrificial film 104 is removed. At the sacrificial film removing step S116, voids 111-1 through 111-8 are sequentially formed from the bottom to the top.

Step S118

Referring to FIG. 9, a conductive film forming step S118 will be described. The conductive film forming step S118 is performed to form a conductive film 112 in the void 111. The conductive film may include a conductive material such as tungsten, for example. At the conductive film forming step S118, the conductive film 112 includes conductive films 112-1 through 112-8 which are sequentially arranged from the bottom to the top.

Now, a substrate processing apparatus 200 and a method of forming a sacrificial film will be described, which are used when the first insulating film forming step S102 and the sacrificial film forming step S104 are performed. The substrate processing apparatus 200 will be described with reference to FIG. 10.

Substrate Processing Device
Process Container

Figure 10:
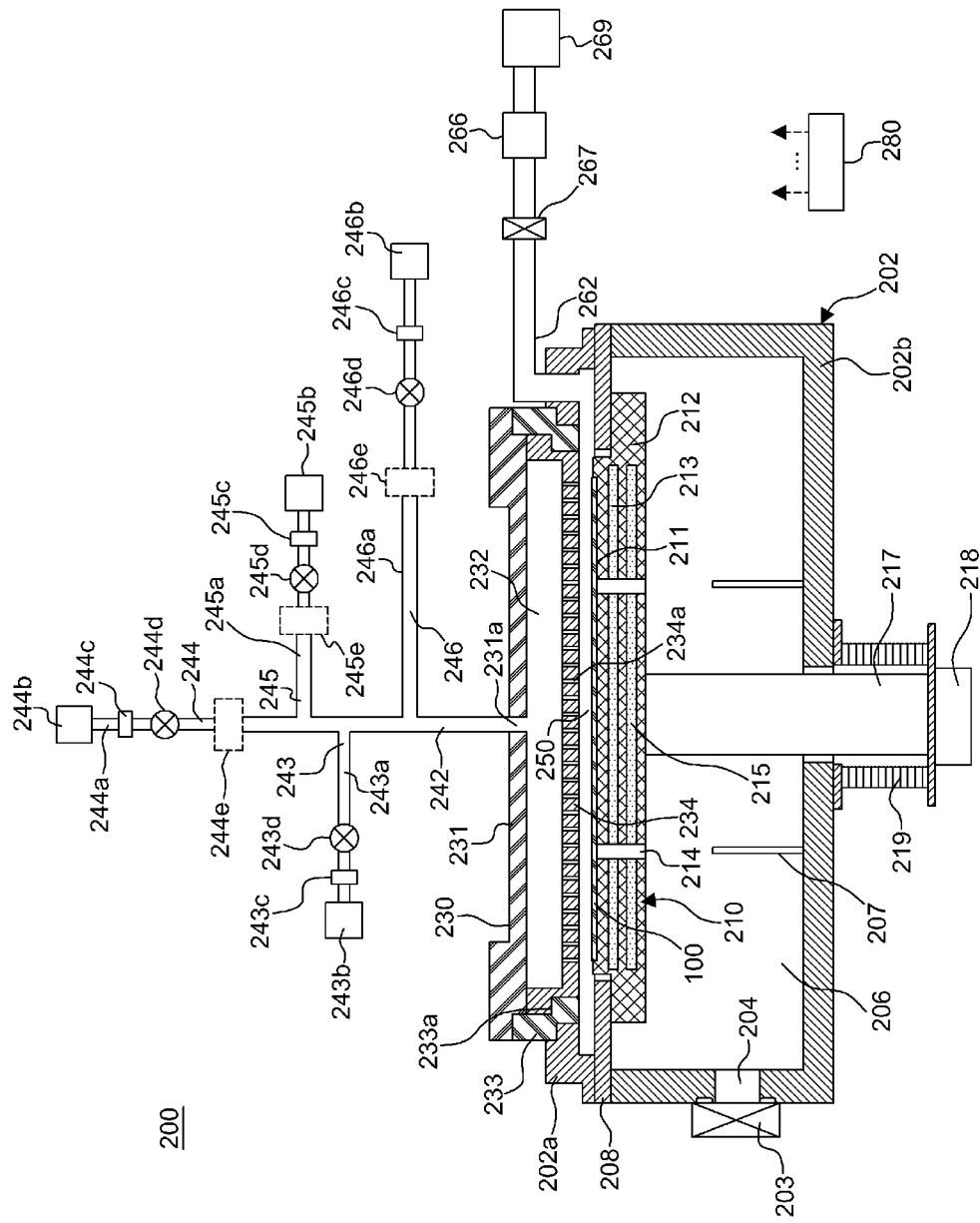
FIG. 10 is a diagram illustrating a substrate processing apparatus according to the first embodiment described herein.

As illustrated in FIG. 10, the substrate processing apparatus 200 includes a process container 202 which is simply referred to as a container. The container 202 is a flat airtight container having a circular cross-section. The container 202 is formed of a metal material such as aluminum and stainless steel (SUS). The container 202 includes a process space 205 where a wafer 100 such as a silicon wafer is processed and a transfer space 206 through which the wafer 100 is passed when the wafer 100 is transferred to the process space 205. The container 202 includes an upper container 202a and a lower container 202b. A partition plate 208 is installed between the upper container 202a and the lower container 202b.

A substrate loading/unloading port 204 is installed at a side surface of the lower container 202b so as to be adjacent to a gate valve 203, and the wafer 100 is moved between a transfer process container (not illustrated) and the lower container 202b through the substrate loading/unloading port 204. Lift pins 207 are installed at the bottom of the lower container 202b.

A substrate support 210 for supporting the wafer 100 is disposed in the process space 205. The substrate support 210 includes a substrate placing table 212, a heater 213 and a bias electrode 215. The substrate placing table 212 has a substrate placing surface 211 on which the wafer 100 is placed, and the heater 213 serves as a heating surface installed in the substrate placing table 212. Through-holes 214 through which the lift pins 207 are passed are formed at positions corresponding to the respective lift pins 207 of the substrate placing table 212. A heater control unit (not illustrated) is connected to the heater 213, and heats the heater 213 at a desired temperature according to an instruction of a controller 280. A bias electrode control unit (not illustrated) is connected to the bias electrode 215, and adjusts an amount of plasma drawn toward the wafer 100 according to an instruction of the controller 280.

A shaft 217 supports the substrate placing table 212. The shaft 217 is formed through the bottom of the process container 202, and connected to an elevating unit 218 outside the process container 202.

The elevating unit 218 includes a support shaft (not illustrated) for supporting the shaft 217 and an operating unit (not illustrated) for moving upward/downward or rotating the support shaft. The operating unit includes an elevating mechanism including a motor for implementing an elevating operation and a rotating mechanism such as a gearwheel for rotating the support shaft.

As the elevating unit 218 is operated to move upward/downward the shaft 217 and the substrate placing table 212, the substrate placing table 212 may move upward/downward the wafer 100 placed on the substrate placing surface 211. Furthermore, as a bellows 219 covers the lower part of the shaft 217, the inside of the process space 205 is airtightly maintained.

When the wafer 100 is transferred, the substrate placing table 212 is moved downward until the substrate placing surface 211 reaches a position facing the substrate loading/unloading port 204. When the wafer 100 is processed, the substrate placing table 212 is moved upward until the wafer 100 reaches a process position in the process space 205 as illustrated in FIG. 10.

A shower head 230 serving as a gas dispersion mechanism is installed above the process space 205, that is, at the upstream side of the process space 205. A through-hole 231a is formed at a lid 231 of the shower head 230. The through-hole 231a communicates with a gas supply pipe 242 described later.

The shower head 230 includes a dispersion plate 234 serving as a dispersion mechanism for dispersing gas. The upstream side of the dispersion plate 234 corresponds to a buffer space 232, and the downstream side of the dispersion plate 234 corresponds to the process space 205. The dispersion plate 234 has a plurality of through-holes 234a installed therein. The dispersion plate 234 is disposed so as to face the substrate placing surface 211. The dispersion plate 234 has a disk shape, for example. The through-holes 234a are installed across the entire surface of the dispersion plate 234.

The upper container 202a includes a flange 233a, and a support block 233 is placed on and fixed to the flange 233a. The dispersion plate 234 is placed on and fixed to the flange 233a. The lid 231 is fixed to the upper surface of the support block 233.

Supply Unit

A common gas supply pipe 242 is connected to the lid 231 so as to communicate with a gas introduction hole 231a formed in the lid 231 of the shower head 230. A first gas supply pipe 243a, a second gas supply pipe 244a, a third gas supply pipe 245a and a modification gas supply pipe 246a are connected to the common gas supply pipe 242.

First Gas Supply System

A first gas source 243b, an MFC (Mass Flow Controller) 243c serving as a flow controller (flow control unit), and a valve 243d serving as an opening/closing valve are sequentially installed at the first gas supply pipe 243a from the upstream side toward the downstream side of the first gas supply pipe 243a.

The first gas source 243b is a source of a first gas containing a first element. The first gas is also referred to as a first element containing gas. The first element containing gas is one of source gases, that is, process gases. In the first embodiment, the first element is silicon (Si). That is, the first element containing gas is a silicon containing gas. Specifically, dichlorosilane ($SiSiCl_2H_2$, referred to as DCS) or hexachlorodisilane ($Si_2Cl_6$, referred to as HCDS) gas is used as the silicon containing gas.

The first gas supply system 243 includes the first gas supply pipe 243a, the MFC 243c and the valve 243d The first gas supply system 243 is also referred to as a silicon containing gas supply system.

Second Gas Supply System

A second gas source 244b, an MFC 244c serving as a flow controller (flow control unit), and a valve 244d serving as an opening/closing valve are sequentially installed at the second gas supply pipe 244a from the upstream side toward the downstream side of the second gas supply pipe 244a.

The second gas source 244b is a source of a second gas containing a second element. The second gas is also referred to as a second element containing gas. The second element containing gas is one of process gases. The second element containing gas may be considered as a reactive gas.

In the first embodiment, the second element containing gas contains the second element different from the first element. The second element is any one of oxygen (O), nitrogen (N) and carbon (C), for example. In the first embodiment, the second element containing gas is a nitrogen containing gas, for example. Specifically, ammonia ($NH_3$) gas is used as the nitrogen containing gas.

When the second gas in a plasma state is used to process the wafer 100, a remote plasma unit 244e serving as a plasma generator may be installed at the second gas supply pipe 244a.

The second gas supply system 244 includes the second gas supply pipe 244a, the MFC 244c and the valve 244d. The second gas supply system 244 is also referred to as a reactive gas supply system. The second gas supply system 244 may further include the remote plasma unit 244e.

Third Gas Supply System

A third gas source 245b, an MFC 245c serving as a flow controller (flow control unit), and a valve 245d serving as an opening/closing valve are sequentially installed at the third gas supply pipe 245a from the upstream side toward the downstream side of the third gas supply pipe 245a. When a third gas is supplied in a plasma state at a substrate processing step, a remote plasma unit 245e serving as a plasma generator may be installed at the third gas supply pipe 245a.

The third gas source 245b is a source of an inert gas. The inert gas is nitrogen ($N_2$) gas, for example.

The third gas supply system 245 includes the third gas supply pipe 245a, the MFC 245c and the valve 245d.

The inert gas supplied from the inert gas source 245b serves as a purge gas which purges gas staying in the container 202 or the shower head 230.

Modification Gas Supply System

A modification gas source 246b, an MFC 246c serving as a flow controller (flow control unit), and a valve 246d serving as an opening/closing valve are sequentially installed at the modification gas supply pipe 246a from the upstream side toward the downstream side of the modification gas supply pipe 246a. When a modification gas is supplied in a plasma state at the substrate processing step, a remote plasma unit 246e serving as a plasma generator may be installed at the modification gas supply pipe 246a.

The modification gas source 246b is a source of the modification gas. The modification gas is a gas such as Ar gas, which has a large molecular size.

The modification gas supply system 246 includes the modification gas supply pipe 246a, the MFC 246c and the valve 246d.

The modification gas supplied from the modification gas source 246b modifies one of or both of SiN and SiO films at the substrate processing system.

Exhaust System

An exhaust system for exhausting the atmosphere of the container 202 will be described. An exhaust pipe 262 is connected to the container 202 so as to communicate with the process space 205. The exhaust pipe 262 is installed at a side surface of the process space 205. An APC (Automatic Pressure Controller) 266 serving as a pressure controller for controlling the internal pressure of the process space 205 to a predetermined pressure is installed at the exhaust pipe 262. The APC 266 includes a valve body (not illustrated) capable of adjusting an opening degree, and adjusts conductance of the exhaust pipe 262 according to an instruction from the controller 280. A valve 267 is installed at the upstream side of the APC 266 in the exhaust pipe 262. The exhaust pipe 262, the valve 267 and the APC 266 will be collectively referred to as the exhaust system.

A DP (Dry Pump) 269 is installed at the exhaust pipe 262. As illustrated in FIG. 10, the DP 269 exhausts the atmosphere of the process space 205 through the exhaust pipe 262.

Controller

Figure 11:
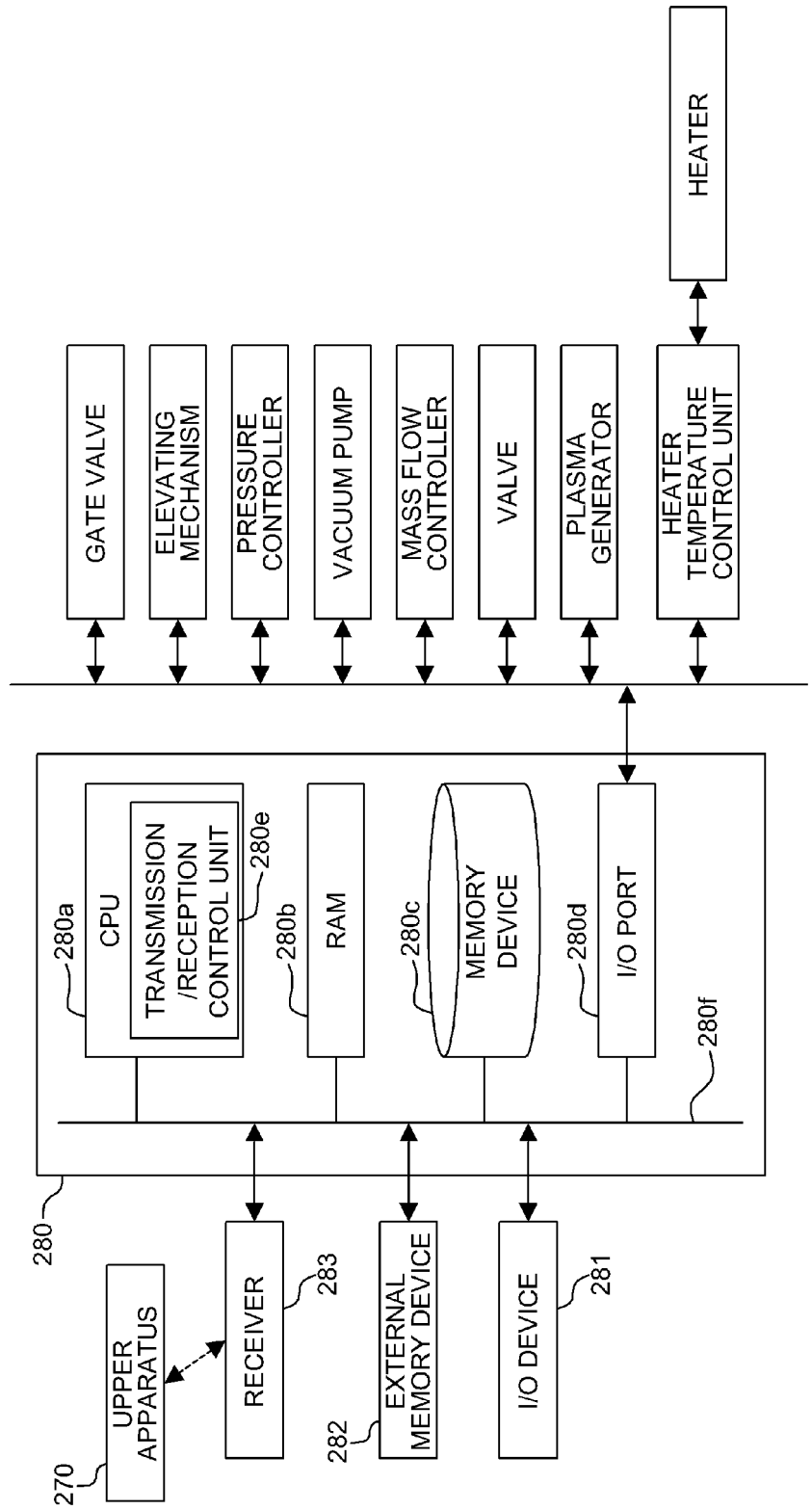
FIG. 11 is a diagram illustrating the substrate processing apparatus according to the first embodiment described herein.
Figure 12:
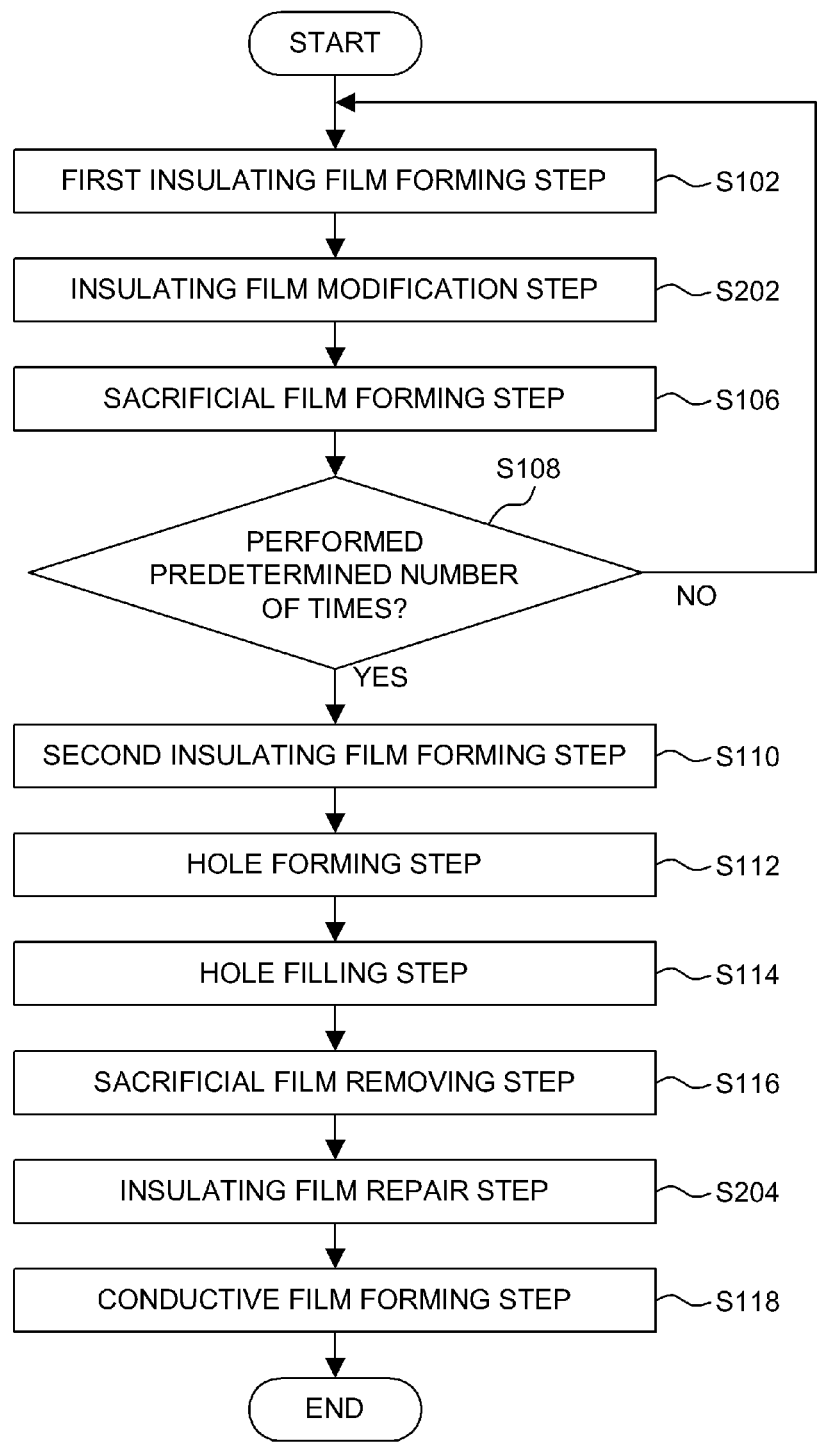
FIG. 12 is a diagram illustrating a manufacturing flow for a semiconductor device according to a second embodiment described herein.

The substrate processing apparatus 200 includes the controller 280 for controlling the operations of the components of the substrate processing apparatus 200. As illustrated in FIG. 11, the controller 280 includes at least an arithmetic unit (CPU) 280a, a temporary memory unit (RAM) 280b, a memory unit 280c and an I/O port 280d. The controller 280 is connected to the respective components of the substrate processing apparatus 200 through the I/O port 280d, calls a program or recipe from the memory unit 280c according to a command of an upper apparatus 270 or a user, and controls the operations of the respective components according to the contents of the program or recipe. The arithmetic unit 280a includes a transmission/reception control unit 280e for controlling transmission and reception of instructions. The controller 280 may be embodied by a dedicated computer or general purpose computer. For example, the controller 280 according to the first embodiment may be embodied by preparing an external memory device 282 storing the above-described program therein, and installing a program in a general purpose computer through the external memory device 282. The external memory device 282 may include a magnetic disk such as a magnetic tape, flexible disk and hard disk, an optical disk such as CD and DVD, a magneto-optical disk such as MO, and a semiconductor memory such as a USB memory (USB flash drive) and memory card. The method for supplying a program to the computer is not limited to the method for supplying a program through the external memory device 282. For example, a communication unit such as the Internet and a dedicated line may be used, or information may be received through a receiver 283 from the upper apparatus 270, and a program may be directly supplied without the external memory device 282 interposed therebetween. Through an I/O device 281 such as a keyboard and touch panel, an instruction may be inputted to the controller 280.

The memory unit 280c or the external memory device 282 is embodied by transitory computer readable recording media. Hereafter, they are collectively referred to as recording media. In this specification, "recording media" may indicate only the memory unit 280c, indicate only the external memory device 282, or indicate both of the memory unit 280c and the external memory device 282.

Now, the sacrificial film forming step S104 and the sacrificial film modification step S106 in FIG. 1 will be described in detail.

Sacrificial Film Forming Step S104

Hereafter, an example in which the sacrificial film 103 is formed using HCDS gas and ammonia (NH$_3$) gas as first and second process gases, respectively, will be described. The sacrificial film includes a silicon nitride (SiN) film.

When the wafer 100 having the insulating film 102 formed thereon is loaded into the process container, the gate valve 203 is closed to seal the process container 202. Then, the substrate placing table 212 is moved upward to place the wafer 100 on the substrate placing surface 211 of the substrate placing table 212, at step S103 of FIG. 1. Then, the substrate placing table 212 is moved upward to lift the wafer 100 to the process position (substrate process position) in the above-described process space 205.

When the wafer 100 is placed on the substrate placing table 212, power is supplied to the heater 213 buried in the substrate placing table 212, in order to control the surface temperature of the wafer 100 to a predetermined temperature. The temperature of the wafer 100 ranges from room temperature to 800° C., for example. Preferably, the temperature of the wafer 100 ranges from room temperature to 700° C. At this time, based on the temperature information sensed by a temperature sensor (not illustrated), the controller 280 extracts a control value, and the temperature control unit 220 adjusts the temperature of the heater 213 by controlling the state of power supplied to the heater 213.

While the wafer 100 is maintained at the predetermined temperature, HCDS gas is supplied to the process space 205 through the first gas supply system 243, and NH$_3$ gas is supplied through the second gas supply system 244. At this time, NH$_3$ gas is excited into a plasma state by the remote plasma unit 244e.

The pyrolyzed HCDS gas and the NH$_3$ gas in a plasma state are present in the process space 205. That is, silicon (Si), chlorine (Cl), nitrogen (N) and hydrogen (H) are mixed and present in the process space 205. Among the elements, Si and N are coupled to form the sacrificial film 103 containing SiN on the wafer 100 as illustrated in FIG. 3. When the sacrificial film 103 having a desired thickness is formed, the supply of HCDS gas and NH$_3$ gas into the process space 205 is stopped, and the HCDS gas and NH$_3$ gas are exhausted from the process space 205. When the gases are exhausted, N$_2$ gas is supplied through the third gas supply system 245, and purges the residual gas.

As described above, Cl and H corresponding to impurities are simultaneously present in the process space 205, in addition to Si and N which are main components of the SiN film. Thus, while the SiN film is formed, Si is coupled to Cl or H, or N coupled to Si is coupled to Cl or H. The impurities penetrate into the SiN film. The inventor of this application has worked hard to discover that the chemical bond between main component and impurity is one cause of tensile stress.

As described above, the tensile stress of the sacrificial film 103 causes a difference in stress from the insulating film 102. Therefore, in the first embodiment, the sacrificial film modification step S106 is performed to modify the sacrificial film 103, such that the tensile stress of the sacrificial film 103 approaches the stress of the insulating film 102.

Sacrificial Film Modification Step S106

The sacrificial film modification step S106 will be described in detail. In the first embodiment, Ar gas is used as the modification gas. The HCDS gas and NH$_3$ gas remaining in the process space 205 are exhausted, and the Ar gas in a plasma state is supplied through the modification gas supply system 246. While the Ar gas is supplied, power is supplied to the bias electrode 215 to draw ions of plasma of the Ar gas toward the sacrificial film 103.

As described above, Si—Cl bond between Si and Cl, Si—H bond between Si and H, Si—NCl bond between Si—N and Cl and Si—NH bond between Si—N and H are present in the sacrificial film 103. The ions of the Ar plasma collide with the sacrificial film 103, and break the chemical bonds to modify the sacrificial film as illustrated in FIG. 4. In the first embodiment, the modified sacrificial film 103 is also referred to as a modified sacrificial film 104. As such, the chemical bonds between main components and impurities are broken to reduce the tensile stress of the sacrificial film 103.

At the sacrificial film modification step S106, the Si—N chemical bond as well as the chemical bond between main component and impurity may be broken. If the Si—N bond is broken, the film quality may be degraded. For example, the film density may be reduced. As illustrated in FIG. 8, however, the sacrificial film 103 is removed through the sacrificial film removing step S116. Thus, although the film quality is degraded, no problems occur.

Figure 7:
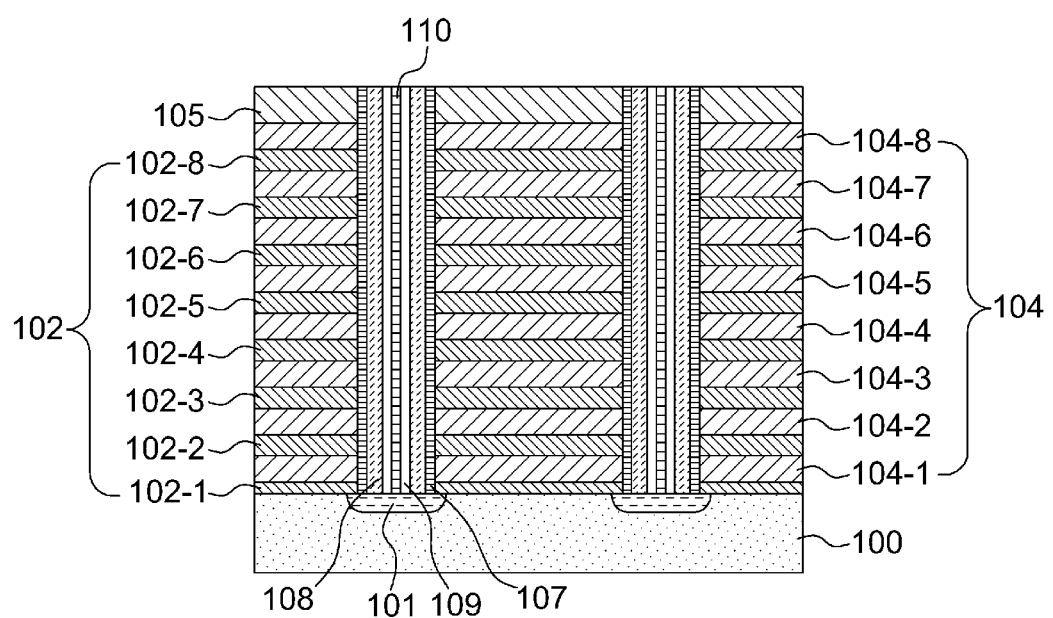
FIG. 7 is a diagram illustrating a state of the processed wafer according to the first embodiment described herein.

When the sacrificial film 103 is changed into the modified sacrificial film 104 of which the tensile stress is reduced, a reduction in damage or yield of the semiconductor device due to a stress difference can be suppressed even though the insulating film 102 and the modified sacrificial film 104 are alternately stacked as illustrated in FIGS. 5 through 7.

In the first embodiment, the step of forming the sacrificial film 103 and the step of changing the sacrificial film 103 into the modified sacrificial film 104 are performed in the one container 202. However, the technique described in this specification is not limited thereto. For example, separate containers corresponding to the respective steps may be prepared, and a wafer may be processed while being moved between the containers. In this case, the process condition between the respective steps such as the step of exhausting atmosphere does not need to be adjusted, or a dedicated device such as an ion injection device may be installed and used, thereby improving productivity. When the same container is used to process a wafer as in the first embodiment, the gate valve does not need to be opened/closed while the wafer is moved. Thus, it is possible to suppress an occurrence of particles by the opening/closing of the gate valve.

Second Embodiment

Now, a second embodiment will be described. The second embodiment has the following differences from the first embodiment. A first difference is that a film to be modified in the first embodiment is different from a film to be modified in the second embodiment. A second difference is that the sacrificial film modification step S106 is not performed, but an insulating film modification step S202 and an insulating film repair step S204 are performed instead.

Hereafter, referring to FIGS. 12 through 18, the second embodiment will be described in detail, focusing on the differences from the first embodiment. Furthermore, the descriptions of the same components as those of the first embodiment, among the components of the second embodiment, are omitted herein.

Step S102

A first insulating film forming step S102 is performed in the same manner as that of the first embodiment. As illustrated in FIG. 2, the first insulating film forming step S102 is performed to form an insulating film 102 on a wafer 100. At this time, the substrate processing apparatus exemplified in FIG. 10 may be used to form the insulating film 102. In the first embodiment, a nitrogen containing gas ($NH_3$ gas) is used as the second gas. In the second embodiment, however, an oxygen containing gas ($O_2$ gas) may be used in place of the nitrogen containing gas ($NH_3$ gas). Furthermore, in the first embodiment, HCDS gas which is a silicon containing gas is used as the first gas. In the second embodiment, however, TEOS [tetraethyl orthosilicate, $Si(OC_2H_5)_4$)] gas is used in place of the HCDS gas.

When the insulating film 102 is formed, TEOS gas is supplied through the first gas supply system 243, and $O_2$ gas in a plasma state is supplied through the second gas supply system 244. When the insulating film 102 having a desired thickness is formed, the supply of TEOS gas and $O_2$ gas into the process space 205 is stopped, and the remaining TEOS gas and $O_2$ gas are exhausted from the process space 205.

Step S202

Figure 13:
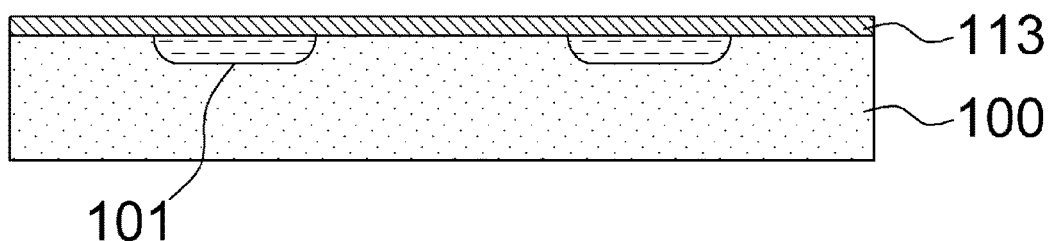
FIG. 13 is a diagram illustrating a state of a processed wafer according to the second embodiment described herein.

An insulating film modification step S202 will be described with reference to FIG. 13. In the second embodiment, the insulating film 102 is modified to form a modified insulating film 113. At the insulating film modification step S202, "modification" means approximating the stress of the insulating film 102 to the stress of the sacrificial film 103. Even during the process of forming the same stacked film as in the first embodiment by performing modification, no stress difference occurs between the modified insulating film 113 and the sacrificial film 103. The details will be described.

Steps S106 and S108

Figure 14:
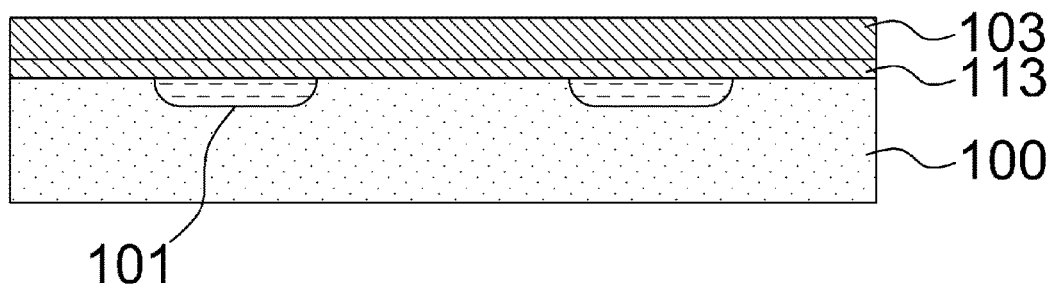
FIG. 14 is a diagram illustrating a state of the processed wafer according to the second embodiment described herein.
Figure 15:
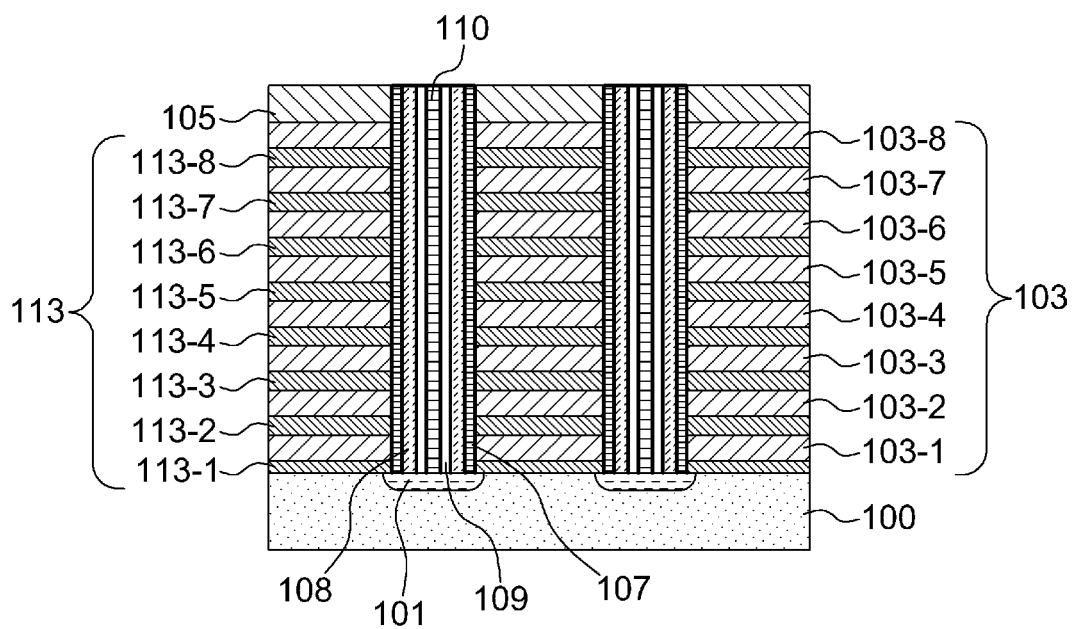
FIG. 15 is a diagram illustrating a state of the processed wafer according to the second embodiment described herein.

The same process as that of the first embodiment is performed to form a sacrificial film 103 on the modified insulating film 113 as illustrated in FIG. 14. Then, a stacked film in which the modified insulating films 113 and the sacrificial films 103 are alternately stacked is formed as illustrated in FIG. 15. In the second embodiment, the modified insulating films 113 include modified insulating films 113-1 through 113-8 which are sequentially arranged from the bottom to the top.

Steps S110 to S114

The same process as that of the first embodiment is performed to form an insulating film 105. Then, a hole 106 is formed, and a passivation film 107, a stacked film 108 of inter-gate insulating film, charge trap film and tunnel insulating film, a channel polysilicon film 109 and a charge insulating film 110 are formed in the hole, thereby forming the same structure as illustrated in FIG. 15. The passivation film 107, the stacked film 108, the channel polysilicon film 109 and the charge insulating film 110 are sequentially arranged from the circumference of the hole 106 to the center.

Step S116

Figures 16A, 16B:
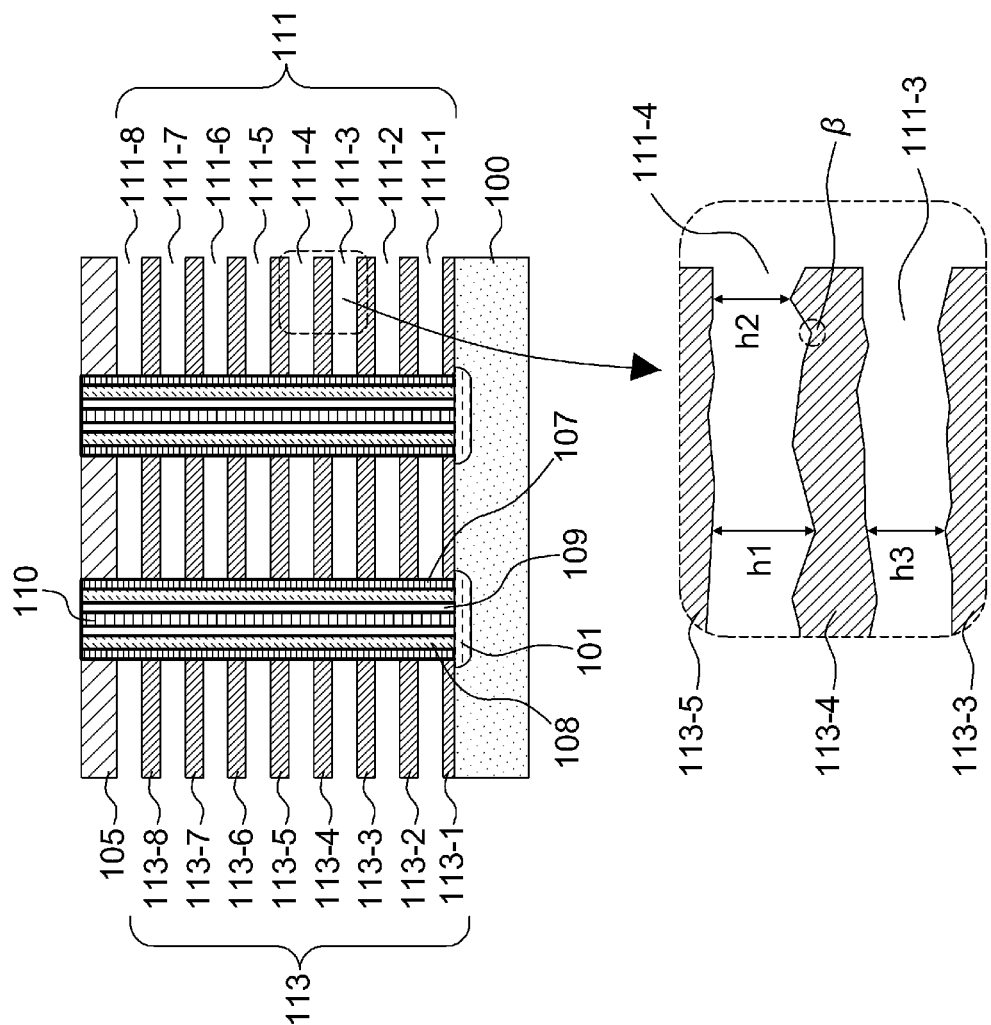
FIGS. 16a and 16b are side and top view diagrams illustrating a state of the processed wafer according to the second embodiment described herein.

Then, a sacrificial film removing step S116 is performed in the same manner as the first embodiment. At the sacrificial film removing step, the sacrificial film 103 is removed by wet etching. As a result, a void 111 is formed at the position from which the sacrificial film 103 is removed, as illustrated in FIG. 16A.

Step S204

The insulating film repair step S204 will be described. At step S204, "insulating film" indicates the modified insulating film 113. Thus, the insulating film repair step S204 may also be referred to as a modified insulating film repair step. As described later, the modified insulating film 113 formed by performing the modification step S202 has low resistance to wet etching.

Thus, when the sacrificial film removing step S116 is performed to remove the sacrificial film 103, the surface of the modified insulating film 113 is also etched. Therefore, the surface of the modified insulating film 113 becomes rough, or a difference in amount of the modified insulating film 113 being etched may occur. FIG. 16B is an expanded view of a portion of FIG. 16A, illustrating the surface roughness of the above-described modified insulating film 113 or the difference in amount of the modified insulating film 113 being etched.

When the surface of the modified insulating film 113 becomes rough or a difference in amount of the modified insulating film 113 being etched occurs, a distance difference between the modified insulating films 113 occurs or the surface of the modified insulating film 113 becomes uneven. The distance difference between the modified insulating films 113 may indicate a difference between a distance between the modified insulating films 113-4 and 113-5 at a predetermined position and a distance between the modified insulating films 113-4 and 113-5 at another position in a horizontal direction, for example, a difference between distances h1 and h2. Furthermore, the distance difference between the modified insulating films 113 may indicate a difference between a distance between the modified insulating films 113-4 and 113-5 and a distance between the modified insulating films 113-3 and 113-4 in a vertical direction, for example, a difference between distances h1 and h3.

When a conductive film 112 is formed in a state illustrated in FIG. 16B, a difference is likely to occur between the thicknesses of the conductive films 112. For example, the thickness of the conductive film 112-4 may differ in the horizontal direction. Furthermore, a distance difference between the conductive films 112-3 and 112-4 may occur. When such a distance or thickness difference occurs, a resistance value of the conductive film 112 may be changed. Therefore, a characteristic difference may occur.

Furthermore, when an aspect ratio of an object to be etched is high and the surfaces of the modified insulating film 113 becomes uneven as illustrated in FIG. 16B, unevenness corresponding to the shape of the modified insulating film 113 is also formed on the conductive films 112. Since an electrical field is concentrated on a convex portion of the conductive film 112 (for example, conductive film formed at β), the convex portion may have a different characteristic from a concave portion of the conductive film 112.

Figure 17:
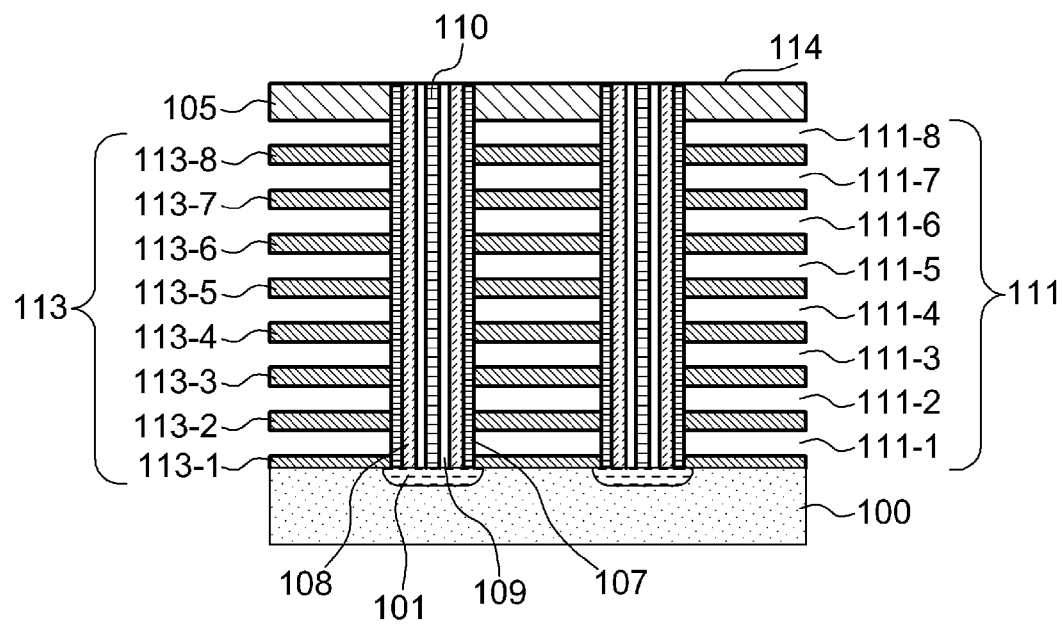
FIG. 17 is a diagram illustrating a state of the processed wafer according to the second embodiment described herein.

Thus, in the second embodiment, the insulating film repair step S204 is performed to repair the surface of the modified insulating film 113. The insulating film repair step S204 is performed to repair the surface of the modified insulating film 113. For example, as illustrated in FIG. 17, an insulating film 114 having the same composition as the modified insulating film 113 is formed on the surface of the modified insulating film 113. Then, the roughness of the modified insulating film 113 is repaired to suppress a distance difference in the horizontal or vertical direction, while reducing unevenness. A method of forming the insulating film 114 will be described later.

At the insulating film repair step S204, the insulating film 114 is formed again. However, a modification process such as diffusion of oxygen corresponding to a component of the insulating film may be performed as long as the surface roughness of the modified insulating film 113 or the difference in amount being etched can be suppressed.

Step S118

Figure 18:
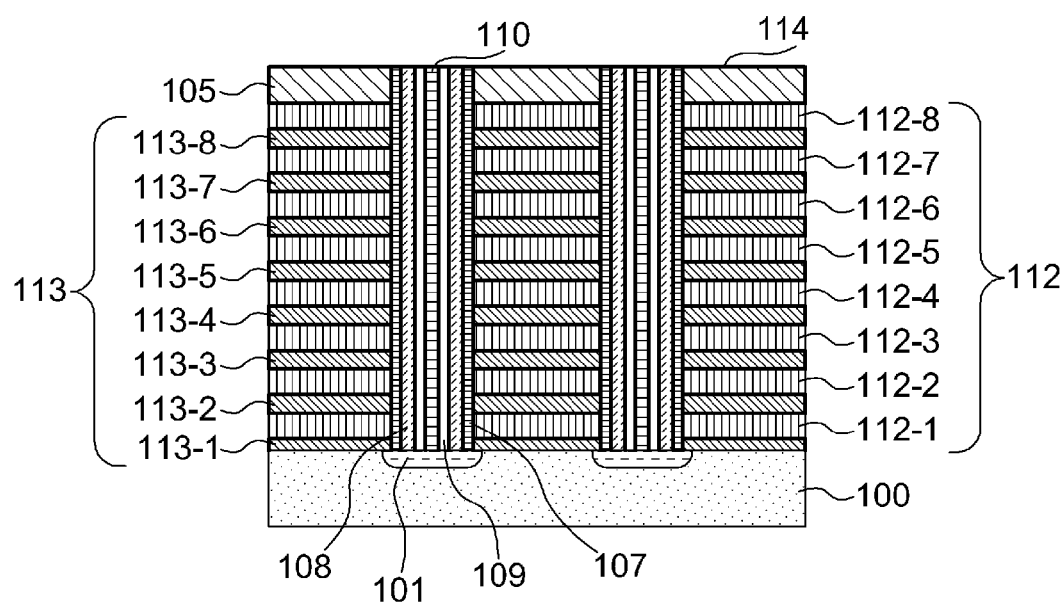
FIG. 18 is a diagram illustrating a state of the processed wafer according to the second embodiment described herein.

A conductive film forming step S118 will be described. As illustrated in FIG. 18, a conductive film 112 is formed in the void 111 at the conductive film forming step S118. The conductive film 112 includes tungsten, for example.

Now, the first insulating film forming step S102, the insulating film modification step S202 and the insulating film repair step S204 will be described in detail.

Step S102

Hereafter, an example in which the insulating film 102 is formed using TEOS gas and oxygen (02) gas as first and second process gases, respectively, will be described. The insulating film includes a silicon oxide (SiO) film.

When a wafer 100 is loaded into the process container 202, the gate valve 203 is closed to seal the process container 202. Then, the wafer 100 is moved upward to the process position (substrate process position) in the process space 205, as in the first embodiment.

When the wafer 100 is placed on the substrate placing table 212, power is supplied to the heater 213 buried in the substrate placing table 212, in order to control the surface temperature of the wafer 100 to a predetermined temperature. The temperature of the wafer 100 ranges from room temperature to 800° C., for example. Preferably, the temperature of the wafer 100 ranges from room temperature to 700° C. At this time, based on the temperature information sensed by the temperature sensor (not illustrated), the controller 280 controls a control value, and the temperature control unit 220 adjusts the temperature of the heater 213 by controlling the state of power supplied to the heater 213.

While the wafer 100 is maintained at a predetermined temperature, TEOS gas is supplied to the process space 205 through the first gas supply system 243, and $O_2$ gas is supplied through the second gas supply system 244. At this time, $O_2$ gas is excited into a plasma state by the remote plasma unit 244e.

The pyrolyzed TEOS gas and the $O_2$ gas in a plasma state are present in the process space 205. That is, Si, O, H and C are mixed and present in the process space 205. Among the elements, Si and O are coupled to form the insulating film 102 containing SiO on the wafer 100 as illustrated in FIG. 2. When the insulating film 102 having a desired thickness is formed, the supply of TEOS gas and $O_2$ gas into the process space 205 is stopped, and the remaining TEOS gas and $O_2$ gas are exhausted from the process space 205.

Insulating Film Modification Step S202

At the insulating film modification step S202, Ar gas is used as a modification gas. As described above, H and C are simultaneously present, in addition to Si and O which are main components of the SiO film. Therefore, while the SiO film is formed, Si coupled to C or O, or O coupled to Si is coupled to C or H. They are present in the SiO film. The inventor of this application has worked hard to discover that the chemical bond between main component and impurity is one cause of compressive stress.

As described above, the compressive stress of the sacrificial film 103 causes a difference in stress from the insulating film 102. Therefore, in the second embodiment, the insulating film modification step S202 is performed to modify the insulating film 102, such that the compressive stress of the insulating film 102 approaches the stress of the sacrificial film 103.

The insulating film modification step S202 will be described in detail. The TEOS gas and $O_2$ gas remaining in the process space 205 are exhausted, and the Ar gas in a plasma state is supplied through the modification gas supply system 246. While the Ar gas is supplied, power is supplied to the bias electrode 215 to draw ions of the Ar gas plasma toward the sacrificial film 103.

As described above, Si—C bond between Si and C, Si—H bond between Si and H, Si—OC bond between Si—O and C, and Si—OH bond between Si—O and H are present in the insulating film 102. The ions of the Ar plasma collide with the insulating film 102, and break the chemical bonds to modify the sacrificial film as illustrated in FIG. 13. In the second embodiment, the modified insulating film 102 is also referred to as a modified insulating film 113. As such, the chemical bonds between main components and impurities are broken to reduce the compressive stress of the sacrificial film 103.

Step S204

The insulating film repair step S204 will be described. At the insulating film modification step S202, the Si—O bond as well as the chemical bond between main component and impurity may be broken. If the Si—O bond is broken, the film density may be lowered to reduce resistance to wet etching. Thus, as described above, the sacrificial film removing step S116 is performed to etch the modified insulating film 113.

Therefore, at the insulating film repair step S204, the etched modified insulating film 113 is repaired. Hereafter, the specific method thereof will be described. At step S204, a repair method using the substrate processing apparatus illustrated in FIG. 10 will be exemplified.

In the present embodiment, an example in which the insulating film 114 is formed using TEOS gas and $O_2$ gas as first and second process gases, respectively, will be described. The insulating film 114 includes SiO like the insulating film 102.

When the wafer 100 processed at the sacrificial film removing step S116 is loaded into the process container 202, the gate valve 203 is closed to seal the process container 202. Then, the wafer 100 is moved upward to the process position (substrate process position) in the process space 205, as in the first embodiment.

When the wafer 100 is placed on the substrate placing table 212, power is supplied to the heater 213 buried in the substrate placing table 212, and the surface temperature of the wafer 100 is controlled to a predetermined temperature. The temperature of the wafer 100 ranges from room temperature to 800° C., for example. Preferably, the temperature of the wafer 100 ranges from room temperature to 700° C. At this time, based on the temperature information sensed by the temperature sensor (not illustrated), the controller 280 extracts a control value, and the temperature control unit 220 adjusts the temperature of the heater 213 by controlling the state of power supplied to the heater 213.

When the wafer 100 is maintained at the predetermined temperature, the TEOS gas is supplied into the process space 205 through the first gas supply system 243. Si of the pyrolyzed TEOS gas adheres to the modified insulating film 113, thereby forming a silicon containing film. After a predetermined time has elapsed, the TEOS gas is exhausted from the process space 205. At this time, impurities such as H which do not adhere to the modified insulating film 113 are exhausted. Then, $O_2$ gas is supplied into the process space 205. The $O_2$ gas reacts with the silicon containing film, and forms a film containing SiO. Furthermore, the $O_2$ gas reacts with C or H of the silicon containing film and generates gases such as $CO_2$ and $H_2O$. After a predetermined time has elapsed, the $O_2$ gas, $CO_2$ and $H_2O$ are exhausted from the process space 205. The process from the supply of the TEOS gas to the exhaust of the $O_2$ gas may be set to one cycle. As the cycle is repeated, the SiO films are stacked to form the insulating film 114 having a desired thickness. In this way, the unevenness of the modified insulating film 113 is repaired. As the unevenness is repaired, the surface roughness of the modified insulating film 113 or a difference in amount of the modified insulating film being etched can be removed.

In the above-described embodiments, the stress of any one of the insulating film and the sacrificial film is adjusted. However, the technique described herein is not limited thereto. For example, the stresses of both of the insulating film and the sacrificial film may be adjusted.

In the above-described embodiments, HCDS or TEOS gas is used as the silicon containing gas, $O_2$ gas is used as the oxygen containing gas, and $NH_3$ gas is used as the nitrogen containing gas. However, the technique described herein is not limited thereto. As long as the same effect can be obtained, the gases may be properly substituted.

Furthermore, in the first embodiment, the insulating film is formed by the apparatus different from the apparatus for forming the sacrificial film. However, the technique described herein is not limited thereto. For example, the insulating film and the sacrificial film may be formed through the same apparatus. In this case, since the first insulating film forming step, the sacrificial film forming step and the modification steps for the insulating film and the sacrificial film can be performed in one container (that is, one substrate processing apparatus), mixing of impurities between the insulating film and the sacrificial film can be suppressed, which makes it possible to significantly improve the characteristic of the semiconductor device.

Moreover, in the above-described embodiments, the Ar gas in a plasma state is used to modify a film. However, the technique described herein is not limited thereto. For example, an ion injection device may be separately prepared, and ions generated by the ion injection device may be injected into the sacrificial film, in order to break a chemical bond between main component and impurity. In this case, an element such as germanium (Ge), which has no direct influence on the film characteristic and has a large ion size, may be used instead of Ar.

Furthermore, in the above-described embodiment, the semiconductor device may be damaged by a difference in coefficient of thermal expansion between the insulating film and the sacrificial film. However, the technique described herein is not limited thereto. For example, when the hole 106 illustrated in FIG. 6 is formed, the semiconductor device may be damaged due to the stress of the insulating film or the sacrificial film. However, the stress of the insulating film or the sacrificial film can be reduced to prevent a damage of the semiconductor device which may occur when the hole 106 is formed.

According to the technique described herein, it is possible to manufacture a semiconductor device having a favorable characteristic over a flash memory with a 3D structure.

What is claimed is:

1. A method of manufacturing a semiconductor device, comprising:
   (a) forming a stacked structure having an insulating film and a sacrificial film stacked therein by performing a combination a plurality of times, the combination comprising: (a-1) forming the insulating film on a substrate; (a-2) forming the sacrificial film on the insulating film; and (a-3) modifying at least one of the insulating film and the sacrificial film to reduce a difference between stresses of the insulating film and the sacrificial film.

2. The method of claim 1, wherein (a-2) comprises forming the sacrificial film using: a silicon-containing gas including at least a silicon component and an impurity; and a nitrogen-containing gas including a nitrogen component, and (a-3) comprises modifying the sacrificial film to reduce a tensile stress of the sacrificial film by breaking a chemical bond between the nitrogen component and the impurity in the sacrificial film or breaking a chemical bond between the silicon component and the impurity in the sacrificial film.

3. The method of claim 2, wherein (a-3) is performed after (a-2) ends and before (a-1) starts.

4. The method of claim 3, further comprising:
   (b) forming a void by removing the sacrificial film after performing (a); and
   (c) forming a conductive film in the void.

5. The method of claim 2, further comprising:
   (b) forming a void by removing the sacrificial film after performing (a); and
   (c) forming a conductive film in the void.

6. The method of claim 1, wherein (a-3) is performed after (a-2) ends and before (a-1) starts.

7. The method of claim 6, further comprising:
   (b) forming a void by removing the sacrificial film after performing (a); and
   (c) forming a conductive film in the void.

8. The method of claim 1, wherein (a-1) comprises forming the insulating film using: a silicon-containing gas including at least a silicon component and an impurity; and an oxygen-containing gas including an oxygen component, and (a-3) comprises modifying the insulating film to reduce a compressive stress of the insulating film by breaking a chemical bond between the oxygen component and the impurity in the insulating film or breaking a chemical bond between the silicon component and the impurity in the insulating film.

9. The method of claim 8, wherein (a-3) is performed after (a-1) ends and before (a-2) starts.

10. The method of claim 9, further comprising:
    (b) forming a void by removing the sacrificial film after performing (a);
    (c) repairing the insulating film after performing (b); and
    (d) forming a conductive film in the void.

11. The method of claim 8, further comprising:
    (b) forming a void by removing the sacrificial film after performing (a);
    (c) repairing the insulating film after performing (b); and
    (d) forming a conductive film in the void.

12. The method of claim 1, wherein (a-3) is performed after (a-1) ends and before (a-2) starts.

13. The method of claim 12, further comprising:
    (b) forming a void by removing the sacrificial film after performing (a);
    (c) repairing the insulating film after performing (b); and
    (d) forming a conductive film in the void.

14. The method of claim 1, further comprising:
    (b) forming a void by removing the sacrificial film after performing (a);
    (c) repairing the insulating film after performing (b); and
    (d) forming a conductive film in the void.

15. A method of manufacturing a semiconductor device, comprising:
    (a) placing a substrate on a substrate support disposed in a processing space, the substrate having an insulating film on a surface thereof;
    (b) forming a sacrificial film on the insulating film using: a silicon-containing gas including at least a silicon component and an impurity; and a nitrogen-containing gas including a nitrogen component; and
(c) modifying at least one of the insulating film and the sacrificial film to reduce a difference between stresses of the insulating film and the sacrificial film.

* * * * *